United States Patent [19]

Urano et al.

[11] Patent Number: 5,800,952
[45] Date of Patent: Sep. 1, 1998

[54] PHOTOPOLYMERIZABLE COMPOSITION FOR A COLOR FILTER, COLOR FILTER AND LIQUID DISPLAY DEVICE

[75] Inventors: Toshiyuki Urano; Ryuichiro Takasaki; Jiro Kamimura; Shingo Ikeda; Noriko Endo; Yuzuru Chika; Tameichi Ochiai, all of Kanagawa, Japan

[73] Assignee: Mitsubishi Chemical Corporation, Tokyo, Japan

[21] Appl. No.: 731,994

[22] Filed: Oct. 23, 1996

[30] Foreign Application Priority Data

Dec. 22, 1995 [JP] Japan ................. 7-334827

[51] Int. Cl.$^6$ ................. G03F 9/00; C09K 19/00
[52] U.S. Cl. ................. 430/7; 430/20; 522/171; 522/168
[58] Field of Search ................. 522/171, 168, 522/71, 75, 76, 81, 120, 121, 182; 430/7, 20

[56] References Cited

U.S. PATENT DOCUMENTS 4,612,384  9/1986  Omura et al. ................. 522/171
5,368,976  11/1994 Tajima et al. ................. 430/7

FOREIGN PATENT DOCUMENTS 0420225   4/1991  European Pat. Off. .
0564168   10/1993 European Pat. Off. .
58054335  3/1983  Japan .
2094329   9/1982  United Kingdom .

OTHER PUBLICATIONS

Webster's Ninth New Collegiate Dictionary, definition for "paint," pp. 846 and 847, 1990.

Primary Examiner—Marion E. McCamish
Assistant Examiner—Cheryl Juska
Attorney, Agent, or Firm—Oblon, Spivak, McClelland, Maier & Neustadt, P.C.

[57] ABSTRACT

A photopolymerizable composition for a color filter, which comprises a photopolymerization initiator system, a compound having at least one ethylenically unsaturated double bond, a colorant, and a phosphoric (meth)acrylate compound and/or an organic carboxylic anhydride having a molecular weight of at most 800, wherein the content of the colorant is from 20 to 90 wt % based on the total solid content.

27 Claims, No Drawings

PHOTOPOLYMERIZABLE COMPOSITION FOR A COLOR FILTER, COLOR FILTER AND LIQUID DISPLAY DEVICE

The present invention relates to a photopolymerizable composition for a color filter. More particularly, it relates to a photopolymerizable composition to be used for production of a color filter which is useful for a color television, a liquid crystal display device, a camera, a solid image pick-up device such as CCD, an electroluminescence, a plasma display or the like.

A color filter is prepared usually by forming color patterns of e.g. stripes or mosaic with a width of from 10 to 500 μm in a precision of a few μm, with three different color phases of red, green and blue, on the surface of a transparent substrate such as a glass or plastic sheet provided with a black matrix. Typical methods for preparation of color filters include, for example, a dyeing method, a printing method, a pigment dispersion method and an electrodeposition method. However, each of these methods has some drawbacks such that the heat resistance is poor, the positional precision of patterns is poor, the production cost is high, or the productivity is poor. Therefore, a suitable method is selected for use depending upon the particular purpose. Among these methods, a pigment dispersion method which comprises coating a photopolymerizable composition containing a colorant on a transparent substrate provided with a black matrix and repeating image exposure, development and heat curing treatment to form a color filter image, has been widely used as a method whereby a color filter having a high heat resistance can be produced, dyeing is not required, the precision in e.g. the film thickness or positioning of the color filter picture elements, is high, the useful life is long, defects such as pin holes are little.

However, this method employs a pigment which has a tinctorial power lower than a dye and thus requires an addition of a large amount of the pigment. Addition of a large amount of the pigment is likely to bring about a deterioration in the developability of the photopolymerizable composition, and there has been a problem that during development, a residue (stain) of the pigment or the photopolymerizable composition remains at a non-image portion.

In the preparation of a color filter, picture elements of red, green and blue are sequentially formed. Accordingly, formation of a stain at a non-image portion causes a deterioration in the color reproducing property of the color filter or the smoothness of the coated film.

To prevent such a stain at a non-image portion, it has been common to employ a method such as control of the developing time, adjustment of the concentration of the developer or removal by a brush. However, by such a method, it has been impossible to completely prevent or remove the stain, and there have been a decrease in the operation efficiency, an increase of costs and a problem also in a waste liquid treatment of the developer.

Further, Japanese Unexamined Patent Publication No. 44651/1988 discloses a method of incorporating an additive such as an organic oxide to a photopolymerizable composition. However, if such an additive is incorporated, the solubility of the resist layer tends to be excessive, although formation of the stain can certainly be suppressed, whereby the sensitivity tends to be low, and peeling of a fine image is likely to result, such being problematic.

Further, a method of incorporating an organic carboxylic acid to a colored resist (Japanese Unexamined Patent Publications No. 369653/1992 and No. 343631/1993) or a method of improving the solubility by increasing the acid value of the binder resin, has been proposed. However, by these methods, it has been impossible to completely prevent the stain at a non-image portion.

The present invention has been made under these circumstances. It is a first object of the present invention to provide a photopolymerizable composition for a color filter excellent in the developability, whereby the stain at the non-image portion is very little.

A second object of the present invention is to provide a photopolymerizable composition for a color filter excellent in the sensitivity and the image-reproducing property.

The present inventors have conducted extensive studies to accomplish the above purposes, and as a result, they have found it possible to improve the developability, the sensitivity, the image-reproducing property and the adhesive property by a photopolymerizable composition for a color filter which comprises a photopolymerization initiator system, a compound having at least one ethylenically unsaturated double bond, a colorant, and a phosphoric (meth)acrylate compound and/or an organic carboxylic anhydride having a molecular weight of at most 800. The present invention has been accomplished on the basis of this discovery.

Now, the present invention will be described in detail with reference to the preferred embodiments.

The photopolymerizable composition for a color filter of the present invention comprises at least a photopolymerization initiator system, a compound having at least one ethylenically unsaturated double bond, (herein after referred to simply as "an ethylenic compound"), a colorant, and a phosphoric (meth)acrylate compound and/or an organic carboxylic anhydride having a molecular weight of at most 800. preferably, it comprises a photopolymerization initiator system which generates radicals upon absorption of light, and a compound having at least two addition-polymerizable ethylenically unsaturated double bonds, of which polymerization is induced by said radicals. More preferably, it is a photopolymerizable composition containing an organic binder polymer material as a binder to improve the compatibility, the coating film-forming property, the developability, the adhesive property, etc.

Among these constituting components, the photopolymerization initiator system may suitably be selected depending upon the light source to be used for exposure, among those having a sensitivity in a range of from ultraviolet to a visible region. However, it is not limited thereto.

Namely, in the present invention, the photopolymerization initiator system which generates radicals upon absorption of an ultraviolet light with a wavelength of less than 400 μm, may, for example, be a dialkylacetophenone system, a benzyl dialkylketal system, benzoin, a benzoin alkylether system, a thioxanthone derivative or an acylphosphine oxide system, as disclosed in e.g. Fine Chemical, 1991, Mar. 1 issue, vol. 20, No. 4, p.16 to p.26, or a hexaaryl biimidazole system or a s-trihalomethyltriazine system as disclosed in Japanese Unexamined Patent Publication No. 40302/1983 and Japanese Examined Patent Publication No. 37377/1970, or a titanocene system as disclosed in Japanese Unexamined Patent Publication No. 152396/1984.

Specifically, it may, for example, be a halomethylated triazine derivative such as (4-methoxyphenyl)-4,6-bis (trichloromethyl)-s-triazine, 2-(4-methoxynaphthyl)-4,6-bis (trichloromethyl)-s-triazine, 2-(4-ethoxynaphthyl)-4,6-bis (trichloromethyl)-s-triazine, or 2-ethoxycarbonyl-4-(4-ethoxynaphthyl)-4,6-bis (trichloromethyl)-s-triazine; a halomethylated oxadiazole derivative; an imidazole derivative such as 2-(2'-chlorophenyl)-4,5-diphenylimidazole dimer, 2-(2'-chlorophenyl)-4,5-di(3-methoxyphenyl) imidazole dimer, 2-(2'-fluorophenyl)-4,5-diphenylimidazole dimer, 2-(2'-methoxyphenyl)-4,5-diphenylimidazole dimer, or 2-(4'-methoxyphenyl)-4,5-diphenylimidazole dimer; a benzoin alkyl ether such as benzoin methyl ether, benzoin phenyl ether, benzoin isobutyl ether, or benzoin isopropyl ether; an anthraquinone derivative such as 2-methylanthraquinone, 2-ethylanthraquinone, 2-t-butylanthraquinone, or 1-chloroanthraquinone; a benzanthrone derivative; a benzophenone derivative such as benzophenone, Michler's ketone, 4,4-bis(diethylamino) benzophenone, 2-methylbenzophenone, 3-methylbenzophenone, 4-methylbenzophenone, 2-chlorobenzophenone, 4-bromobenzophenone, or 2-carboxybenzophenone; an acetophenone derivative such as 2,2-dimethoxy-2-phenylacetophenone, 2,2-diethoxy-2-phenylacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, or 1,1,1-trichloromethyl-(p-butylphenyl)ketone; a thioxanthone derivative such as thioxanthone, 2-ethylthioxanthone, 2-isopropylthioxanthone, 2-chlorothioxanthone, 2,4-dimethylthioxanthone, 2,4-diethylthioxanthone, or 2,4-diisopropylthioxanthone; a benzoic acid ester derivative such as ethyl p-dimethylaminobenzoate or ethyl p-diethylaminobenzoate; an acridine derivative such as 9-phenylacridine, or 9-(p-methoxyphenyl)acridine; a phenazine derivative such as 9,10-dimethylbenzphenazine; or a titanium derivative such as bis(cyclopentadienyl)-bis(2,6-difluoro-3-(pyl-1-yl)titanium. These compounds are useful for polymerizing an ethylenic unsaturated group in a monomer which will be described hereinafter, by the action of radicals generated by a ultraviolet light. These photopolymerization initiators may be used alone or in combination as a mixture of two or more of them. For example, combinations with initiators as disclosed in e.g. Japanese Examined Patent Publication No. 12802/1978 and Japanese Unexamined Patent Publications No. 279903/1989, No. 48664/1990, No. 164902/1992 and No. 75373/1994, may be mentioned.

On the other hand, a photopolymerization initiator system which is sensitive to a visible light with a wavelength of from 400 μm to 500 μm, may, for example, be a system comprising a hexaaryl biimidazole, a radical-forming agent and a dye (Japanese Examined Patent Publication No. 37377/1970), a system comprising hexaaryl biimidazole and (p-dialkylaminobenzylidene)ketone (Japanese Unexamined Patent Publications No. 2528/1972 and No. 155292/1979), a system comprising a cyclic cis-α-carbonyl compound and a dye (Japanese Unexamined Patent Publication No. 84183/1973), a system comprising a substituted triazine and merocyanine dye (Japanese Unexamined Patent Publication No. 151024/1979), a system comprising ketocumarin and an activating agent (Japanese Unexamined Patent Publications No. 112681/1977, No. 15503/1983 and No. 88005/1985), a system comprising a substituted triazine and a sensitizer (Japanese Unexamined Patent Publications No. 29803/1983 and No. 40302/1983), a system comprising biimidazole, a styrene derivative and thiol (Japanese Unexamined Patent Publication No. 56403/1984), a system comprising a sensitizer containing a dialkylaminophenol group and a biimidazole (Japanese Unexamined Patent Publications No. 60/1990, No. 168088/1982, No. 107761/1993, No. 210240/1993 and No. 288818/1992), a system comprising an organic peroxide and a dye (Japanese Unexamined Patent Publications No. 140203/1984 and No. 189340/1984), a system of titanocene (Japanese Unexamined Patent Publications No. 152396/1984, No. 151197/1986, No. 10602/1988, No. 41484/1988, No. 291/1990, No. 12403/1991, No. 20293/1991, No. 27393/1991 and No. 52050/1991), or a system of a combination of titanocene, a xanthene dye and an addition polymerizable ethylenically unsaturated double bond-containing compound having an amino group or an urethane group (Japanese Unexamined Patent Publications No. 221958/1992 and No. 219756/1992).

preferred examples of the photopolymerization initiator system which is sensitive to light with a wavelength of from 400 nm to 500 nm include a composite photopolymerization initiator comprising a sensitizing colorant which shows absorption at a wavelength of from 400 to 500 nm, a hexaaryl biimidazole such as 2,2'-bis(o-chlorophenyl)-4,4', 5,5'-tetraphenylbiimidazole (hereinafter referred to simply as "compound R-1"), 2,2'-bis (o-chlorophenyl)-4,4 ', 5,5'-tetra(p-carboethoxyphenyl) biimidazole, 2,2'-bis(p-chlorophenyl)-4,4 ', 5,5'-tetra(p-bromophenyl)biimidazole, or 2,2'-bis(o-chlorophenyl)-4,4 ', 5,5'-tetra(o,p-dichlorophenyl)biimidazole, and an organic thiol compound such as 2-mercaptobenzthiazole, 2-mercaptobenzoxazole or 2-mercaptobenzimidazole, and a composite photopolymerization initiator comprising a sensitizing colorant showing absorption at a wavelength of from 400 to 500 nm, a titanocene compound such as dicyclopentadienyl-Ti-bis-2, 6-difluoro-3-(pyrrol-1-yl)-phenyl-1-yl (hereinafter referred to simply as "compound S-1"), dichloropentadienyl-Ti-bis-2,3,4,5,6- tetrafluorophenyl-1-yl, or di-cyclopentadienyl-Ti-bis-2,3,4,5,6-pentafluorophenyl-1-yl, and a dialkylaminophenyl compound such as ethyl p-diethylaminobenzoate or Michler's ketone.

The colorant which sensitizes the above hexabiimidazole may, for example, be sensitizing colorants as disclosed in Japanese Unexamined Patent Publications No. 69/1990, No. 168088/1982, No. 107761/1993, No. 210240/1993 and No. 288818/1992.

Further, the colorant which sensitizes titanocene, may, for example, be sensitizing colorants disclosed in Japanese Patent Applications No. 83588/1993 and No. 84817/1993, Japanese Unexamined Patent Publication No. 83587/1993, and Japanese Patent Applications No. 12949/1994, No. 74743/1994 and No. 141588/1994.

Among these photopolymerization initiator systems which are sensitive to lights in a visible light range, those which show absorption not only in a visible light range but also in a ultraviolet light range and which show high sensitivity, may be used as photopolymerization initiator systems against a light source in the ultraviolet light range.

As the one which shows high sensitivity in both the visible light range and the ultraviolet light range, a photopolymerization initiator system containing a hexaaryl biimidazole or titanocene, may be mentioned.

Among the above photopolymerization initiator systems, a photopolymerization initiator system containing hexaaryl biimidazole or titanocene is preferred, since such an initiator system exhibits high sensitivity.

The ethylenic compound to be used in the present invention may be a compound having one ethylenically unsaturated double bond, of which polymerization is induced in the presence of a photopolymerization initiator system, such as isobutyl acrylate, t-butyl acrylate, lauryl acrylate, cetyl acrylate, stearyl acrylate, cyclohexyl acrylate, isobonyl acrylate, benzyl acrylate, 2-methoxyethyl acrylate, 3-methoxybutyl acrylate, ethylcarbitol acrylate, phenoxyethyl acrylate, tetrahydrofuryl acrylate, 2-hydroxyethyl acrylate, 2-hydroxypropyl acrylate, 2-acryloyloxyethylhydrogen phthalate, 2-acryloyloxypropylhydrogen phthalate, 2-acryloyloxypropyltetrahydrohydrogen phthalate, morpholinoethyl methacrylate, trifluoroethyl (meth)acrylate, tetrafluoropropyl (meth)acrylate, hexafluoropropyl (meth) acrylate, octafluoropentyl (meth)acrylate, heptadecafluorododecyl acrylate, trimethylsiloxyethyl methacrylate, N-vinylpyrrolidone, N-vinylcaprolactam, phenoxypolyethylene glycol (meth)acrylate, or methoxypropylene glycol (meth)acrylate. However, it is preferably the one having at least two ethylenic unsaturated bonds. Specifically, it is preferred to employ an ethylenic compound having at least two ethylenically unsaturated double bonds obtained by an addition reaction of a polyglycidyl ether compound with an unsaturated monocarboxylic acid or by an addition reaction of a polyhydroxy compound with an epoxy monocarboxylic acid ester, or an ethylenic compound having at least two ethylenically unsaturated double bonds, obtained by an addition reaction (an esterification reaction) of an aliphatic polyhydroxy compound with an unsaturated carboxylic acid.

Such a ethylenic compound provides a function of improving the developability or the adhesion to the transparent substrate.

Specific examples of such an ethylenic compound include an ethylenic compound obtained by an addition reaction in the presence of e.g. a quaternary ammonium salt as a catalyst, of an unsaturated monocarboxylic acid such as (meth)acrylic acid, with a polyglycidyl ether compound which is obtained by an addition reaction under an alkaline condition of epichlorohydrin with a polyhydroxybenzene such as hydroquinone, resorcinol or pyrogallol, a bisphenol A derivative such as bisphenol A, polybisphenol A, brominated bisphenol A, or polybrominated bisphenol A, an aromatic polyhydroxy compound such as novolak, or an intranuclear hydrogenated product thereof; and a compound obtained by an addition reaction in the presence of an acid or alkali catalyst as disclosed in e.g. "SYNTHETIC COMMUNICATION, 24(21)" 3009–3019 (1994), of an epoxy (meth)acrylate such as glycidyl (meth)acrylate, or a compound of the following formula (T-1) or (T-2), with a polyhydroxybenzene such as hydroquinone, resorcinol or pyrogallol, a bisphenol A derivative such as bisphenol A, polybisphenol A, brominated bisphenol A or polybrominated bisphenol A, an aromatic polyhydroxy compound such as novolak, or an intranuclear hydrogenated product thereof.

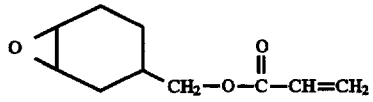

(T-1)

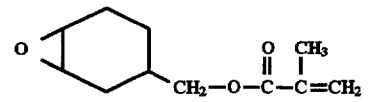

(T-2)

The above hydrogenation reaction may be suitably selected from the one employing a Raney nickel catalyst as disclosed in Japanese Unexamined Patent Publication No. 107160/1991 and the one employing a catalyst such as rhodium or platinum.

It is particularly preferred to use an ethylenic compound (A) of a co-condensation polymer type of epichlorohydrin with bisphenol A, a bisphenol A derivative or an intranuclear hydrogenated product thereof, since such a compound is excellent in the adhesion of the image to the substrate at the time of developing (the developed image adhesive property) as compared with other ethylenic compounds.

A particularly preferred ethylenic compound (A) may be the one which has a viscosity of at least 100 ps at 25° C., more preferably at least 1000 ps at 25° C. If this viscosity is substantially lower than 100 ps, the developed image adhesive property tends to be low.

On the other hand, specific examples of an ethylenic compound which has a function of improving the solubility of a non-image portion at the time of development and forming an image of a high image quality, include (meth) acrylates, such as 1,4-butanediol di(meth)acrylate, 1,6-hexanediol di(meth)acrylate, 1,9-nonanediol di(meth) acrylate, neopentyl glycol di(meth)acrylate, tetraethylene glycol di(meth)acrylate, tripropylene glycol di(meth) acrylate, propylene glycol di(meth)acrylate, glycerol methacrylate (meth)acrylate, ethylene oxide-added di(meth) acrylate of bisphenol A, trimethylolpropane tri(meth) acrylate, pentaerythritol tri(meth)acrylate, pentaerythritol tetra(meth)acrylate, trimethylolpropane ethylene oxide-added tri(meth)acrylate, glycerol propylene oxide-added tri (meth)acrylate, ethylene glycol di(meth)acrylate, triethylene glycol di(meth)acrylate, trimethylolpropane tri(meth) acrylate, trimethylolethane tri(meth)acrylate, pentaerythritol di(meth)acrylate, pentaerythritol tri(meth)acrylate, pentaerythritol tetra(meth)acrylate, dipentaerythritol tetra(meth) acrylate, dipentaerythritol penta(meth)acrylate, dipentaerythritol hexa(meth)acrylate, dipentaerythritolmonohydroxy penta(meth)acrylate, and glycerol (meth)acrylate; itaconates having (meth)acrylate of such compounds changed to itaconate; crotonates having (meth)acrylate of such compounds changed to crotonate; and maleates having (meth)acrylate of such compounds changed to maleate. These monomers may be used alone or in combination as a mixture of two or more of them. Among these monomers, at least trifunctional acrylic monomers, particularly tetrafunctional to hexafunctional dipentaerythritol (meth)polyacrylates, are preferred, since they are excellent in the image-forming properties.

In the preparation of the above ethylenic compound, a saturated monocarboxylic acid may be added together with the unsaturated monocarboxylic acid at the time of reacting the polyglycidyl ether compound or a polyhydroxy compound with the unsaturated monocarboxylic acid, so that the physical properties such as the viscosity of the ethylenic compound can be controlled.

Further, examples of an ethylenic compound which can be used in combination, include an acrylamide such as ethylene bisacrylamide, an allylester such as diallyl phthalate, a vinyl group-containing compound such as divinyl phthalate, a polyester obtained by a polycondensation reaction of an unsaturated dibasic carboxylic acid with a dihydroxy compound, a polyamide obtained by a polycondensation reaction of an unsaturated dibasic carboxylic acid and a diamine, a condensation polymer of a dibasic carboxylic acid having an unsaturated bond in its side chain, such as itaconic acid, propylidene succinic acid or ethylidene malonic acid, with a dihydroxy or diamine compound, and a polymer obtained by a polymer reaction of a polymer having a functional group having a reactivity such as a hydroxyl group or a halogenated methyl group in its side chain, such as polyvinyl alcohol, poly(2-hydroxyethylmethacrylate) or polyepichlorohydrin, with an unsaturated carboxylic acid such as acrylic acid, methacrylic acid or crotonic acid.

To the color filter resist of the present invention, an organic binder polymer material may be incorporated as a binder for the purpose of improving the film forming property or the developability of the resist. Such an organic binder polymer material may, for example, be an alkyl ester which may have a substituent, of (meth)acrylic acid, such as methyl (meth)acrylate, ethyl (meth)acrylate, propyl (meth)acrylate, isopropyl (meth)acrylate, butyl (meth)acrylate, 2-ethylhexyl (meth)acrylate, hydroxyethyl (meth)acrylate, hydroxypropyl (meth)acrylate, benzyl (meth)acrylate, glycidyl (meth)acrylate, or N,N-dimethylaminoethyl (meth)acrylate; a phenyl ester which may have a substituent, of (meth)acrylic acid, such as hydroxyphenyl (meth)acrylate, or methoxyphenyl (meth)acrylate; acrylonitrile; vinyl carboxylate such as vinyl acetate, vinyl bersatate, vinyl propionate, vinyl cinnamate, or vinyl pivalate; a copolymer of e.g. styrene or α-methylstyrene; a polyether of chlorohydrin with bisphenol A; soluble nylon; a polyvinylalkyl ether; a polyamide; a polyurethane; a polyethylene terephthalate isophthalate; acetylcellulose; a polyvinyl formal; or a polyvinyl butyral.

In this specification, "(meth)acryl" means "acryl or methacryl". The same applies to "(meth)acrylate".

In the present invention the organic binder polymer material is preferably an alkali-soluble polymer. One of the preferred examples of such an alkali-soluble polymer is a polymer comprising a monomer having a carboxylic group such as a (meth)acrylic acid monomer. photopolymerizable composition comprising such an alkali-soluble binder polymer is preferable for the environmental reason because such photopolymerizable composition can be developed with alkali aqueous solution but not with organic solvent.

With respect to those having carboxylic acid groups, among the above organic binder polymer materials, it is possible to react some or all of the carboxylic acid groups with glycidyl (meth)acrylate or an epoxy (meth)acrylate of the above structural formula (T-1) or (T-2) to obtain photopolymerizable organic binder polymer materials, for the purpose of improving the coating film strength, the coating solvent resistance or the adhesion to the substrate of the resulting coating film.

In the present invention, a particularly preferred organic binder polymer material is a copolymer comprising from 10 to 80 mol %, preferably from 20 to 70 mol %, more preferably from 30 to 60 mol %, of a comonomer having a phenyl group, such as styrene, α-methylstyrene, benzyl (meth)acrylate, hydroxyphenyl (meth)acrylate, methoxyphenyl (meth)acrylate, hydroxyphenyl (meth)acrylamide, or hydroxyphenyl (meth)acrylsulfonamide, and from 2 to 50 wt %, preferably from 5 to 40 wt %, more preferably from 5 to 30 wt %, of (meth)acrylic acid, or a reaction product having from 2 to 50 mol %, preferably from 5 to 40 mol %, more preferably from 10 to 30 mol %, of epoxy (meth)acrylate added, to the total co-monomers.

The amount of acidic groups contained in the organic binder polymer material is preferably at a level of an acid value of from 30 to 250 (KOH-mg/g), more preferably from 40 to 200 (KOH-mg/g). If the amount of acidic groups in the organic binder polymer material is small, and the acid value is lower than this range, the solubility in an alkali developing solution tends to be low, whereby a development residue is likely to form, and in an extreme case, development will be impossible. On the other hand, if the amount of acidic groups is large, and the acid value exceeds this range, the solubility in the alkali developer solution tends to be too high, and deterioration in the sensitivity or film roughening during development tends to occur.

Further, the molecular weight of the organic binder polymer material is within a range of from 1,000 to 1,000,000, preferably from 2,000 to 500,000, more preferably from 3,000 to 200,000, by weight average molecular weight (Mw), as measured by GpC (gel permeation chromatography) and calculated as polystyrene. If Mw of the organic binder polymer material is substantially lower than this range, film reduction at an image portion occurs during development, whereby it tends to be difficult to obtain a good coating film, and stickiness after drying tends to be high. On the other hand, if Mw of the organic binder polymer material is substantially high, the developability tends to be poor, such that removal at the non-image portion during development tends to be inadequate, whereby definition of the pattern tends to be poor.

Further, the organic binder polymer material may be the one having a polymerizable group such as a polymerizable double bond introduced in its side chain. By introducing a polymerizable double bond in the side chain of the organic binder polymer material, it is possible to increase the reactivity of the organic binder polymer material and to improve the sensitivity and the chemical resistance. As such a method, a known method may be mentioned, as disclosed in e.g. Japanese Examined Patent Publications No. 34443/1975 and No. 34444/1975.

The content of the above-mentioned photopolymerization initiator system is usually from 0.1 to 40 wt %, preferably from 0.2 to 30 wt %, more preferably from 0.2 to 20 wt %, based on the total solid content of the photopolymerizable composition for a color filter (the photopolymerizable image-forming material which does not contain a colorant). The content of the above-mentioned ethylenic compound is usually from 5 to 90 wt %, preferably from 10 to 80 wt %, more preferably from 15 to 70 wt %, based on the total solid content of the photopolymerizable image-forming material. The content of the above-mentioned organic binder polymer material is usually from 0 to 80 wt %, preferably from 10 to 70 wt %, more preferably from 20 to 60 wt %, based on the total solid content in the photopolymerizable image-forming material.

As the colorant to be used for a color filter resist, a colorant of a black color is used for a color filter resist for black matrix, and for color filter resists for red, green and blue, the corresponding colorants are used.

The colorant of a black color may, for example, be carbon black, such as MA-7, MA-100, MA-220, #5 or #10, manufactured by Mitsubishi Chemical Corporation, or Color Black FW200, Color Black FW2, or Printex V, manufactured by DEGUSU Co., graphite as disclosed in Japanese Unexamined Patent Publication No. 311109/1993 or No. 11613/1994, an inorganic black pigment as disclosed in e.g. Japanese Unexamined Patent Publication No. 322219/1992 or No. 274503/1991; an organic pigment such as an azo type black pigment as disclosed in e.g. Japanese Unexamined Patent Publication No. 216102/1990, or a black pigment prepared by mixing organic colorants such as red, green, blue, yellow, cyan and magenta.

Specifically, the colorants corresponding to red, green and blue include, for example, Victoria pure Blue (42529), Auramine O (41000), Carotene Brilliant Flavin (basic 13) Rhodamine 6GCP (45160), Rhodamine B (45170), Safranine OK70:100 (50240), Erioglaucine X (42080), No. 120/ Lyonol Yellow (21090), Lyonol Yellow GRO (21090), Simular Fast Yellow 8GF (21105), Benzidine Yellow 4T-564D (21095), Simular Fast Red 4015 (12355), Lyonol Red 7B4401 (15850), Fastgen Blue TGR-L (74160), Lyonol Blue SM (26150), Lyonol Blue ES (pigment blue 15:6, pigment blue 1536), Lyonogen Red GD (pigment red 168, pigment red 108), and Lyonol Green 2YS (pigment green 36). The numerals in the above brackets ( ) indicate the color indices (C.I.).

Other pigments may be identified by C.I., for example as follows:

C.I. yellow pigments: 20, 24, 86, 93, 109, 110, 117, 125, 137, 138, 147, 148, 153, 154, 166, 168; C.I. orange pigments: 36, 43, 51, 55, 59, 61; C.I. red pigments: 9, 97, 122, 123, 149, 168, 177, 180, 192, 215, 216, 217, 220, 223, 224, 226, 227, 228, 240; C.I. violet pigments: 19, 23, 29, 30, 37, 40, 50; C.I. blue pigments: 15, 15:1, 15:4, 15:6, 22, 60, 64; C.I. green pigments: 7, 36; C.I. brown pigments: 23, 25, 26; and C.I. black pigment: 7.

The content of such a colorant in a color filter resist is usually from 20 to 90 wt %, but it is specifically as follows.

Namely, with respect to a black matrix formed by a black color filter resist, the content of the above black colorant contained in the color filter resist is usually from 20 to 90 wt %, preferably from 30 to 80 wt %, more preferably from 40 to 70 wt %, based on the total solid content, in order to form a black matrix having a light transmission density of at least 2.5, preferably at least 3.0 with a coating film formed to have a film thickness of at most 1.0 μm, preferably from 0.3 to 0.9 μm, more preferably from 0.5 to 0.8 μm.

On the other hand, with respect to a colorant picture element formed by a red, green or blue color filter resist, the amount of the red, green or blue colorant contained in the color filter resist is usually within a range of from 20 to 70 wt %, preferably from 25 to 60 wt %, more preferably from 30 to 50 wt %, based on the total solid content, in order to form a colorant picture element having a light transmission density of at least 1.1, preferably at least 1.3, with the coating film formed to have a film thickness of at most 2 μm, preferably from 0.5 to 1.5 μm, more preferably from 0.6 to 1.0 μm.

The above black, red, green or blue transmission density can be obtained by measurement by means of a Macbeth densitometer TR-927 employing an optical filter corresponding to each color.

When incorporated to the photopolymerizable composition for a color filter of the present invention, the phosphoric (meth)acrylate to be used in the present invention, provides a function to improve removal at the non-image portion at the time of development of the color filter resist employing such a photopolymerizable composition, thereby to prevent formation of a stain at the non-image portion and to improve the adhesion of a fine image to provide a high image reproducibility.

The phosphoric (meth)acrylate is a phosphoric ester compound having one or more (meth)acryloyl groups. Specifically, it may, for example, be the one represented by the following formula (I):

wherein $R^1$ is hydrogen or a methyl group, $R^2$ is a $C_{1-15}$ alkylene group which may have a substituent (said substituent being a $C_{1-15}$ alkyl group, Br, Cl or a $C_{1-15}$ alkyleneoxy group), a is an integer of from 1 to 3, and n is an integer of from 0 to 10. More specifically, it may, for example, be as follows:

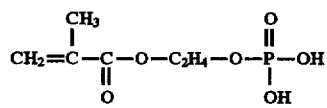

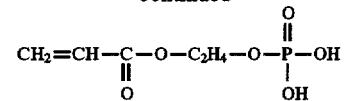

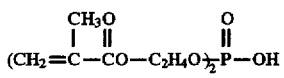

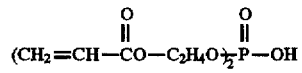

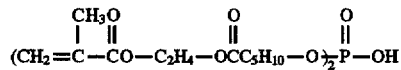

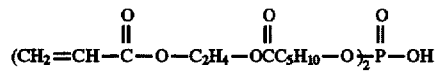

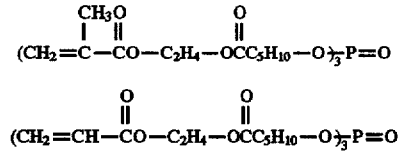

The organic carboxylic anhydride having a molecular weight of at most 800, to be used in the present invention, may be an aliphatic carboxylic anhydride or an aromatic carboxylic anhydride. Specifically, the aliphatic carboxylic anhydride may, for example, be acetic anhydride, trichloroacetic anhydride, trifluoroacetic anhydride, tetrahydrophthalic anhydride, succinic anhydride, maleic anhydride, itaconic anhydride, glutaric anhydride, 1,2-cyclohexanedicarboxylic anhydride, n-octadecylsuccinic anhydride, or 5-norbornene-2,3-dicarboxylic anhydride. The aromatic carboxylic anhydride may, for example, be phthalic anhydride, trimellitic anhydride, pyromellitic anhydride, or naphthalic anhydride. Among them, particularly preferred is the one having a molecular weight of at most 600, more preferably from 50 to 500, specifically maleic anhydride, succinic anhydride or itaconic anhydride. By incorporation of such an organic carboxylic anhydride to the photopolymerizable composition for a color filter of the present invention, formation of a stain at the non-image portion will be suppressed, and the developability will be improved. Especially, with a conventional photopolymerizable composition, the stain at a non-image portion will remain if the time for development is short, and the image is likely to peel, if the time for development is long even slightly, and thus the allowable range for the time for development used to be very narrow. Whereas, by the addition of an organic carboxylic anhydride, such an allowable range has been expanded, and it has been made possible to readily produce a color filter free from the stain or peeling of the image, even without precisely controlling the time for development.

The amount of the phosphoric (meth)acrylate and/or the organic carboxylic anhydride having a molecular weight of at most 800, is usually within a range of from 0.1 to 50 wt %, preferably from 0.5 to 30 wt %, more preferably from 1 to 10 wt %, based on the total solid content in the total photopolymerizable composition excluding the colorant.

particularly preferred is a color filter resist of the present invention which is capable of not only forming a colorant picture element or a black matrix image with a high image quality in such a high colorant content state, but also providing solvent resistance against a coating solvent for e.g. a colorant photopolymerizable layer formed on each picture element or for a protective layer of e.g. polyamide or polyimide, and a high adhesive property to the transparent substrate.

Such a color filter resist is coated in the form of a coating solution prepared by using a suitable solvent.

The solvent to be used for coating the color filter resist of the present invention, is not particularly limited, and it may, for example, be an organic solvent such as methanol, ethanol, propanol, butanol, toluene, chloroform, dichloromethane, tetrahydrofuran, diisopropyl ether, mineral spirit, n-pentane, amyl ether, ethyl caprylate, n-hexane, diethyl ether, isoprene, ethyl isobutyl ether, butyl stearate, n-octane, Varsol #2, Apco #18 solvent, diisobutylene, amyl acetate, butyl acetate, apco thinner, butyl ether, diisobutyl ketone, methylcyclohexene, methyl nonyl ketone, propyl ether, dodecane, Socal solvent No. 1 and No. 2, amyl formate, dihexyl ether, diisopropyl ketone, Solvesso #150, n-,sec- or t-butyl acetate, hexene, Shell TS28 solvent, butyl chloride, ethyl amyl ketone, ethyl benzoate, amyl chloride, ethylene glycol diethyl ether, ethyl orthoformate, methoxymethylpentanone, methyl ethyl ketone, methyl butyl ketone, methyl isobutyl ketone, methyl hexyl ketone, methyl isobutylate, benzonitrile, ethyl propionate, methyl cellosolve acetate, methyl isoamyl ketone, methyl isobutyl ketone, propyl acetate, amyl acetate, amyl formate, dicyclohexyl, diethylene glycol monoethyl ether acetate, dipentene, methoxymethylpentanol, methyl amyl ketone, methyl isopropyl ketone, propyl propionate, propylene glycol t-butyl ether, methyl cellosolve, ethyl cellosolve, butyl cellosolve, ethyl cellosolve acetate, carbitol, diethylene glycol monomethyl ether, cyclohexane, ethyl acetate, methyl lactate, ethyl lactate, propylene glycol, propylene glycol monomethyl ether, propylene glycol monomethyl ether acetate, propylene glycol monoethyl ether, propylene glycol monoethyl ether acetate, dipropylene glycol monoethyl ether, dipropylene glycol monomethyl ether acetate, 3-methoxypropionic acid, 3-ethoxypropionic acid, methyl 3-ethoxypropionate, ethyl 3-ethoxypropionate, methyl 3-methoxypropionate, ethyl 3-methoxypropionate, propyl 3-methoxypropionate, butyl 3-methoxypropionate, diglyme, ethylene glycol acetate, ethylcarbitol, butylcarbitol, ethylene glycol monobutyl ether, propylene glycol t-butyl ether, 3-methyl-3-methoxybutanol, tripropylene glycol methyl ether, or 3-methyl-3-methoxybutyl acetate.

These solvents may be used alone or in combination as a mixture of two or more of them. As the solvent, it is preferred to use the one having a boiling point within a range of from 100° to 200° C., particularly within a range of from 120° to 170° C.

The coating solution is prepared by using such a solvent, so that the concentration of the color filter resist (the total amount of the colorant and the photopolymerizable image-forming material) will be within a range of from 5 to 50 wt %, preferably from 10 to 30 wt %.

Now, a method for preparing a color filter by using a color filter resist coating solution of the present invention, will be described.

The transparent substrate for the color filter may, for example, be a plastic sheet of e.g. a polyester such as polyethylene terephthalate or a polyolefin such as polypropylene or polyethylene, or various glass sheets.

To such a transparent substrate, in order to improve the physical property such as the adhesive property of the surface, corona discharge treatment, ozone treatment, or treatment for forming a thin film of e.g. a silane coupling agent or a polymer such as urethane polymer, may be applied as the case requires.

The thickness of the transparent substrate is preferably within a range of from 0.05 to 10 mm, more preferably from 0.1 to 7 mm. In a case where treatment for forming a thin film of a polymer is carried out, the film thickness is preferably within a range of from 0.01 to 10 µm, more preferably from 0.05 to 5 µm.

On this transparent substrate, it is common to preliminarily form a thin metal film or a black matrix employing the photopolymerizable composition for black matrix, prior to forming the picture element images of red, green and blue. As an example of the thin metal film, a single chromium layer or a double layer of chromium and chromium oxide, may be mentioned. A thin layer of such material is formed by e.g. vapor deposition or sputtering, and a photosensitive coating film is formed thereon. Then, using a photomask having repeating patterns of stripe, mosaic, triangle or the like, exposure is carried out, followed by development, to form a resist image. Then, the thin film is subjected to etching treatment to form a black matrix on the substrate.

On such a transparent substrate having a black matrix formed thereon, a color filter resist containing a colorant having one of red, green and blue colors, is coated by a coating device such as a spinner, a wire bar, a flow coater, a dye coater, a roll coater or a spray, followed by drying at a temperature of from 50° to 200° C., preferably from 60° to 180° C., for from 15 seconds to 10 minutes, preferably from 30 seconds to 5 minutes, to form the colorant photopolymerizable layer. The thickness of the photopolymerizable layer obtained by coating a coating solution of the color filter resist, followed by drying, is preferably from 0.2 to 3 µm, more preferably from 0.5 to 2 µm.

Here, the higher the drying temperature, the better the adhesive property to the transparent substrate, and the higher the resist sensitivity. On the other hand, if the drying temperature is too high, the photopolymerizable initiator system tends to be decomposed, thus leading to heat polymerization to cause development failure. If the drying temperature is too low, the sensitivity decreases, so that it becomes difficult to form an image.

Then, a negative photomask for colorant picture elements is placed on this colorant photopolymerizable layer, and image exposure is carried out through this photomask by means of a light source of e.g. ultraviolet or visible light. At that time, to prevent deterioration of the sensitivity of the photopolymerizable layer by oxygen, an oxygen-shielding layer such as a polyvinyl alcohol layer may be formed on the photopolymerizable layer, prior to the exposure, as the case requires.

Then, development treatment is carried out with a developing solution to form the first colorant picture element image on the transparent substrate. If necessary, prior to this development treatment, the exposed specimen is subjected to heat treatment at a temperature of from 70° to 200° C. for from 15 seconds to 20 minutes, preferably at a temperature of from 80° to 150° C. for from 30 seconds to 10 minutes, for the purpose of improving the sensitivity of the photopolymerizable layer or the γ-value (gradation).

The development treatment is preferably carried out usually at a developing temperature of from 20° to 40° C., preferably from 20° to 35° C., usually for from 10 seconds to 5 minutes, by a method such as dipping development, spray development, brushing development or ultrasonic wave development.

If necessary, the sample after development may be subjected to heat curing treatment at a temperature of from 100° to 300° C. for from 5 to 60 minutes or to photocuring treatment with exposure in a quantity of more than the proper exposure, preferably in a quantity of from 1 to 10 times the proper exposure.

For the developing solution to be used for the development treatment, an organic solvent such as acetone, toluene or methyl ethyl ketone may be employed. However, an alkali developing solution or a neutral developing solution containing a surfactant, is preferred. The alkali developing solution is an aqueous solution containing an inorganic alkali agent such as sodium carbonate, potassium carbonate, potassium hydrogencarbonate, sodium silicate, potassium silicate, sodium hydroxide, potassium hydroxide or aqueous ammonia, or an organic alkali agent such as diethanolamine, triethanolamine or tetraalkylammonium hydroxide and containing a surfactant, a water-soluble organic solvent, or a low molecular weight compound having a hydroxyl group or a carboxylic group, for the purpose of improving the image quality or shortening the time for development, as the case requires.

The surfactant for the developing solution may, for example, be an anionic surfactant such as sodium naphthalenesulfonate or sodium benzenesulfonate, a nonionic surfactant having polyalkyleneoxy groups, or a cationic surfactant having tetraalkylammonium groups. The water-soluble organic solvent may, for example, be ethanol, propion alcohol, butanol, methylcellosolve, butylcellosolve, phenylcellosolve, ethylene glycol, diethylene glycol, triethylene glycol, tetraethylene glycol, propylene glycol, dipropylene glycol, tripropylene glycol, tetrapropylene glycol or propylene glycol monomethyl ether.

The low molecular weight compound having a hydroxyl group or a carboxyl group, may, for example, be 1-naphthol, 2-naphthol, pyrogallol, benzoic acid, succinic acid or glutaric acid.

The neutral developing solution is an aqueous solution containing a surfactant such as the above-mentioned anionic surfactant or nonionic surfactant and containing the water-soluble organic solvent or the low molecular weight compound having a hydroxyl group or a carboxylic acid group, as mentioned above, for the same purpose as mentioned above, as the case requires.

Such a developing solution may contain a defoaming agent, a pH controlling agent, etc.

Then, with respect to color filter resists of other two colors among red, green and blue, they are respectively coated and dried in the same manner as above, and then each sample is exposed and developed in the same manner as above employing a negative photomask for a colorant picture element, followed by heat or photocuring treatment, as the case requires, to obtain a color filter having three color picture elements on the black matrix.

The color filter thus prepared may be used as it is, and ITO (transparent electrode) is formed thereon. In that form, the color filter is used as a part of materials for a color display. Further, a top coating layer such as a polyamide or polyimide layer, may be provided, for the purpose of improving the surface flatness or durability of the color filter.

The light source to be used for image exposure may, for example, be a lamp light source such as a xenon lamp, a halogen lamp, a tungsten lamp, a high pressure mercury lamp, a metal halide lamp, a medium pressure mercury lamp or a low pressure mercury lamp, or a laser light source such as an argon ion layer, a YAG laser, an excimer laser or a nitrogen laser. For such a light source, an optical filter may optionally be used depending upon the required wavelength region of irradiating light. In a case where a black matrix is formed by using a color filter resist of the present invention which contains a black colorant, the same method as the method for forming a red, green or blue picture element image on the transparent substrate, may be employed, to form the black matrix. By repeating the operation for forming the black matrix twice, the black matrix images may be laminated to complete a black matrix image having a desired transmission density.

In the foregoing, the method of forming red, green and blue picture element images on a transparent substrate having a black matrix formed thereon, has been described. However, it is also possible to employ a method wherein a black matrix is formed after forming the red, green and blue picture element images.

Further, at the time of forming black stripes or red, green and blue colorant picture element images, on the transparent substrate by means of the color filter resists of the present invention, it is possible to form a photo-cured adhesive layer having a photopolymerizable composition containing no colorant photo-cured on the transparent substrate, for the purpose of improving the developed image adhesive property of the color filter resist and the transparent substrate, and/or the adhesive property of the heat-cured image.

The photopolymerization initiator system, the ethylenic compound and the optional organic binder polymer material, contained in the photopolymerizable composition to be used for the photo-cured adhesive layer, may suitably be selected for use among the constituting components of the above-mentioned color filter resists of the present invention. Such a photo-cured adhesive layer may be formed by coating the photopolymerizable composition on a transparent substrate usually by the same method as mentioned above so that the dried film thickness would be within a range of from 0.01 to 2 μm, preferably from 0.02 to 1 μm, and then the coated photopolymerizable composition is photo-cured by exposure in a quantity of from 1 to 10 times of the proper exposure for the coated photopolymerizable composition.

Further, for the purpose of preventing formation of defects such as scratch marks or peeling from the transparent substrate as time passes, of the resist images of black stripes or red, green and blue colorant picture elements, formed on the transparent substrate by using the color filter resists of the present invention, a photo-cured layer may be formed on the transparent substrate having such resist images formed thereon, by the same method as for the above photo-cured adhesive layer.

Now, the present invention will be described in further detail with reference to Examples and Comparative Examples. However, it should be understood that the present invention is by no means restricted by such specific Examples.

EXAMPLES 1 TO 14 AND COMPARATIVE
EXAMPLES 1 to 5

A coating solution of a photopolymerizable composition for a color filter comprising the following photopolymerization initiator system I or II, the following organic binder polymer material ①, the following ethylenic compound ① or ②, the following colorant ①, ② or ③, the following phosphoric (meth)acrylate ①, ② or ③ and 500 parts by weight of propylene glycol monomethyl ether acetate (PGMA) as a coating solvent, was dispersed for 15 hours by using a paint shaker containing zirconia beads having a diameter of 0.5 mm in an amount of 3.6 times by weight, relative to the solution.

The colorant-containing photopolymerizable coating solution thus prepared was coated on a glass substrate (No. 7059, manufactured by Corning Co.) by a wire bar coater so that the dried film thickness would be as identified in Table 1, followed by drying for 2 minutes at a drying temperature as identified in Table 1. Then, using a negative photomask repeating masks of 330 μm in length and 110 μm in width with a pitch of 80 μm, exposure was carried out with a proper quantity of exposure as identified in Table 1 by a 2 kw high pressure mercury lamp. Then, developing treatment was carried out by immersing the specimen in an aqueous solution containing 0.2 wt % of diethanolamine and 0.5 wt % of a nonionic surfactant (New vol B-18, manufactured by Nippon Nyukazai K.K.) as a standard developing solution at 25° C. for 1 minute, followed by water shower washing under a pressure of 1 kg for 1 minute, to form the colorant image. The sample was evaluated by the following evaluation methods, and the results are shown in Table 1.

TABLE 1

| | Photopolymerization initiator system (*1) | Ethylenic compound (*1) | Organic polymer material (*1) | Additive (*1) | Drying temp. (°C.) | Pigment (*2) | Film thickness (μm) | Proper quality of exposure (mJ/cm²) | Stain | Image quality | Adhesive property |
|---|---|---|---|---|---|---|---|---|---|---|---|
| Example 1 | I | ① (15) | ① (24) | ① (3) | 120 | ① (30) | 1.3 | 80 | A | A | A |
| Example 2 | I | ② (15) | ① (24) | ② (3) | 120 | ② (30) | 1.3 | 100 | A | A | A |
| Example 3 | II | ① (15) | ① (24) | ① (3) | 120 | ③ (30) | 1.3 | 70 | A | A | A |
| Comparative Example 1 | I | ① (15) | ① (24) | ④ (3) | 120 | ① (30) | 1.3 | 180 | B | C | C |
| Comparative Example 2 | I | ② (15) | ① (24) | ⑤ (2) | 120 | ② (30) | 1.3 | 200 | C | D | D |
| Comparative Example 3 | II | ① (15) | ① (24) | ④ (3) | 120 | ③ (30) | 1.3 | 150 | C | B | B |
| Comparative Example 4 | I | ① (15) | ① (24) | — | 120 | ① (30) | 1.3 | 80 | D | B | B |
| Example 4 | II | ② (15) | ① (24) | ③ (3) | 120 | ③ (30) | 1.3 | 90 | A | A | A |
| Example 5 | II | ① (15) | ① (24) | ① (3) | 120 | ② (30) | 1.3 | 60 | A | A | A |
| Example 6 | II | ① (15) | ① (24) | ⑥ (3) | 120 | ① (30) | 1.3 | 80 | A | A | |
| Example 7 | II | ① (15) | ① (24) | ⑥ (3) | 120 | ② (30) | 1.3 | 100 | A | A | |
| Example 8 | II | ① (15) | ① (24) | ⑥ (3) | 120 | ③ (30) | 1.3 | 70 | A | A | |
| Example 9 | II | ① (15) | ① (24) | ⑥ (3) + ① (3) | 120 | ① (30) | 1.3 | 80 | A | A | |
| Example 10 | II | ① (15) | ① (24) | ⑥ (3) + ① (3) | 120 | ② (30) | 1.3 | 100 | A | A | |
| Example 11 | II | ① (15) | ① (24) | ⑥ (3) + ① (3) | 120 | ③ (30) | 1.3 | 70 | A | A | |
| Example 12 | II | ① (15) | ① (24) | ① (3) | 80 | ④ (45) | 1.0 | 2000 | A | A | A |
| Example 13 | II | ① (15) | ① (24) | ⑥ (3) | 80 | ④ (45) | 1.0 | 2000 | A | A | A |
| Example 14 | II | ① (15) | ① (24) | ⑥ (3) + ① (3) | 80 | ④ (45) | 1.0 | 2000 | A | A | A |
| Comparative Example 5 | II | ① (15) | ① (24) | | 80 | ④ (45) | 1.0 | 3000 | D | D | D |

*1: The numeral in the brackets ( ) indicates parts by weight.
*2: The numeral in the brackets ( ) indicates wt % of the pigment to the total solid content of the resist.

Ethylenic compound
① Dipentaerythritol hexaacrylate
② pentaerythritol triacrylate Colorant
① Red pigment: Lyonogen Red GD (manufactured by Toyo Ink K.K.)/Lyonogen Orange R (manufactured by Toyo Ink K.K.)=13:5 (weight ratio)
② Green pigment: Lyonol Green 2YS (manufactured by Toyo Ink K.K.)/Lyonogen Yellow 3G (manufactured by Toyo Ink K.K.)=9:17 (weight ratio)
③ Blue pigment: Lyonol Blue ES (manufactured by Toyo Ink K.K.)/Lyonogen Violet RL (manufactured by Toyo Ink K.K.)=13.5:3.5 (weight ratio)
④ Black pigment: Carbon Black MA-220 (manufactured by Mitsubishi Chemical Corporation)

| Photopolymerization initiator system | | |
|---|---|---|
| I: | Michler's ketone | 2 parts by weight |
| | S-1 | 2 parts by weight |
| | Ethyl p-diethylaminobenzoate | 2 parts by weight |
| II: | Michler's ketone | 2 parts by weight |
| | R-1 | 2 parts by weight |
| | 2-Mercaptobenzothiazole | 2 parts by weight |

-continued

Organic binder polymer material

① 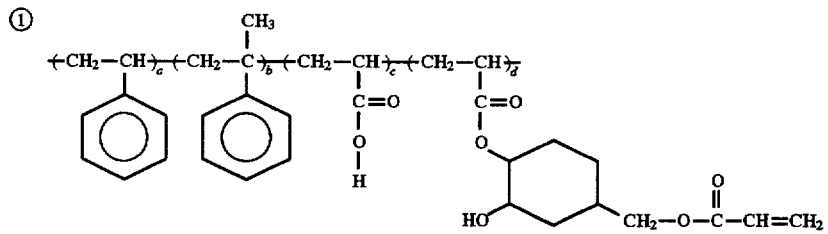

(a:b:c:d=55:15:20:10 (mol %), Mw: 12,000)

Acid value: 80

Additive

①

② 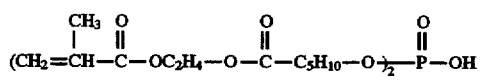

③ 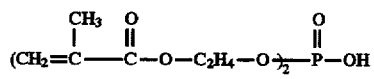

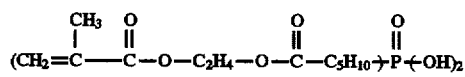

④ Succinic acid

⑤ polyacrylic acid (Julima Ac-10L, manufactured by Nippon Junyaku K.K.).

⑥ Maleic anhydride

⑦ Itaconic anhydride

⑧ Oxalic acid

⑨ Itaconic acid

⑩ Maleic acid

⑪ phthalic acid

Image quality

In the same manner as above, a colorant photopolymerizable coating solution was coated and dried on a glass substrate, followed by exposure with a proper quantity of exposure by means of a Ugler test chart, and development treatment by means of a developing solution, to form a colorant image. The fine line image in the colorant image was observed by a microscope under 400 magnifications, and from the line width of the reproduced finest line, the image quality was evaluated by the following standards. The finer the reproduced fine line, the better the image quality.

A: A fine line with a line width of less than 10 μm is reproduced.

B: A fine line with a line width of from 10 to 15 μm is reproduced.

C: A fine line with a line width of from 15 to 25 μm is reproduced.

D: A fine line with a line width of more than 25 μm is reproduced.

In this specification, the proper quantity of exposure (the proper quantity of exposure on the coated side) is the quantity of exposure at which line widths of the finest lines in the negative and positive fine line images in the test chart image are the same, when exposure is conducted through a Ugler test chart on a colorant polymerizable layer by varying the quantity of exposure, followed by development treatment with the above-mentioned standard developing solution to obtain the colorant image of the test chart.

Stain on a non-image portion

In the same manner as above, a colorant photopolymerizable coating solution was coated and dried on a glass substrate, followed by development treatment to remove the colorant photopolymerizable layer from the entire surface, whereupon the surface of the specimen was irradiated with light at an angle of 10° from the surface by means of a 15 W tungsten lamp light source for a microscope, and the presence or absence of the residual film remaining on the surface was visually inspected from scattering of light and evaluated under the following standards.

A: No residual film was observed.

B: The residual film was observed over from 1 to 20% of the glass surface.

C: The residual film was observed over from 21 to 40% of the glass surface.

D: The residual film was observed over at least 41% of the surface.

EXAMPLES 15 TO 18 AND COMPARATIVE EXAMPLES 6 to 10

The operation was carried out in the same manner as in Example 1 except that the composition of the photopolymerizable composition was as shown in Table 2, and it was coated on a glass substrate by a spin coater, dried at 80° C. for 1 minute by a hot plate, then exposed with a quantity of exposure as identified in Table 2, followed by development treatment with a potassium hydroxide aqueous solution for a developing time as identified in Table 2, whereby the results as shown in Table 2 were obtained. The dissolving time is the time until the non-exposed portion of the resist film has completely been dissolved, as visually observed.

TABLE 2

| | Photopolymerization initiator system (*1) | Ethylenic compound (*1) | Organic polymer material (*1) | Additive (*1) | Drying temp. (°C.) | Pigment (*2) | Film thickness (μm) | Proper quality of exposure (mJ/cm²) | Dissolving time (sec) | Developing time (sec) | Stain | Adhesive property |
|---|---|---|---|---|---|---|---|---|---|---|---|---|
| Example 15 | II | ① (15) | ① (24) | ⑥ (3) | 80 | ① (30) | 1.5 | 80 | 15 | 30 | A | A |
| Example 16 | II | ① (15) | ① (24) | ⑦ (3) | 80 | ① (30) | 1.5 | 80 | 20 | 30 | A | A |
| Example 17 | II | ① (15) | ① (24) | ⑥ (3) | 80 | ① (30) | 1.5 | 100 | 15 | 30 | A | A |
| Example 18 | II | ① (15) | ① (24) | ⑦ (3) | 80 | ① (30) | 1.5 | 100 | 20 | 30 | A | A |
| Comparative Example 6 | II | ① (15) | ① (24) | ⑧ (3) | 80 | ① (30) | 1.5 | 80 | 40 | 60 | C | B |
| Comparative Example 7 | II | ① (15) | ① (24) | ⑨ (3) | 80 | ① (30) | 1.5 | 80 | 40 | 60 | C | B |
| Comparative Example 8 | II | ① (15) | ① (24) | ⑩ (3) | 80 | ① (30) | 1.5 | 80 | 40 | 60 | C | B |
| Comparative Example 9 | II | ① (15) | ① (24) | ⑪ (3) | 80 | ① (30) | 1.5 | 80 | 40 | 60 | C | B |
| Comparative Example 10 | II | ① (15) | ① (24) | — | 80 | ① (30) | 1.5 | 80 | 40 | 60 | D | B |

*1: The numeral in the brackets ( ) indicates parts by weight.
*2: The numeral in the brackets ( ) indicates wt % of the pigment to the total solid content of the resist.

Adhesive property

In the same manner as above, a colorant photopolymerizable coating solution was coated and dried on a glass substrate, then properly exposed by means of a Ugler chart and subjected to development treatment by means of a developing solution to form a colorant image. The colorant image was heat-cured at 200° C. for 30 minutes by a convection oven. This colorant image was subjected to a peeling test by an adhesive tape, whereupon the line width of the finest line adhered on the substrate, was observed by a microscope with 400 magnifications. The adhesive property was evaluated by the following standards. The finer the line adhered, the better the adhesive property.

A: A fine line with a line width of less than 10 μm is adhered.

B: A fine line with a line width of from 10 to 15 μm is adhered.

C: A fine line with a line width of from 15 to 25 μm is adhered.

D: A fine line with a line width of more than 25 μm is adhered.

EXAMPLES 19 TO 30 AND COMPARATIVE EXAMPLES 11 to 22

A color resist photosensitive solution was prepared to have the blend proportions as identified in Table 3, and the solution was coated by a spin coater on a glass substrate having chromium vapor-deposited thereon. This sample was dried at 80° C. for 1 minute on a hot plate. The dried film thickness of the color resist was 1.5 μm.

Then, the sample was exposed with 200 mj/cm² by a high pressure mercury lamp through a mask pattern and then immersed in a 0.05 wt % sodium hydroxide aqueous solution for 1 minute for development. After the development, the sample was thoroughly rinsed with water and then dried. The non-image portion of the developed sample was observed by a microscope with 50 magnifications, whereby the presence or absence of a stain was determined. The results are shown in Table 4.

TABLE 3

| Components | Compound names | Amounts (parts by weight) |
|---|---|---|
| Binder resin | Styrene/acrylic acid copolymer Weight ratio: styrene/acrylic acid = 60/40 Weight average molecular weight: 10000 Acid value: 120 | 100 |
| Photopolymerization initiator | 2-(2'-Chlorophenyl)-4,5-diphenyl-imidazole dimer | 8 |
| | Michler's ketone | 20 |
| Monomer | Dipentaerythritol hexaacrylate | 50 |
| Pigment | C.I. Pigment Red 177 | 100 |
| Solvent | Propylene glycol monomethyl ether acetate | 1000 |
| Additive | As shown in Table 4 | 5 |

TABLE 4

| Examples | Additives Chemical names | Molecular weight | Stain* |
|---|---|---|---|
| Example 19 | Acetic anhydride | 102.29 | O |
| Example 20 | Trichloroacetic anhydride | 308.76 | O |
| Example 21 | Trifluoroacetic anhydride | 210.03 | O |
| Example 22 | Tetrahydrophthalic anhydride | 152.15 | O |
| Example 23 | Succinic anhydride | 100.07 | O |
| Example 24 | Maleic anhydride | 98.06 | O |
| Example 25 | Itaconic anhydride | 112.09 | O |
| Example 26 | Glutaric anhydride | 114.10 | O |
| Example 27 | 1,2-Cyclohexane dicarboxylic anhydride | 154.16 | O |
| Example 28 | n-Octadecylsuccinic anhydride | 352.56 | O |
| Example 29 | Phthalic anhydride | 148.12 | O |
| Example 30 | Pyromellitic anhydride | 218.12 | O |
| Comparative Example 11 | No additive | | X |
| Comparative Example 12 | Styrene/maleic anhydride polymer | 1000 | X |
| Comparative Example 13 | p-Toluenesulfonic acid | 172 | X |
| Comparative Example 14 | p-Methoxyphenol | 124.14 | X |
| Comparative Example 15 | Hydrochloric acid | 36.5 | X |
| Comparative Example 16 | Acetic acid | 60.05 | X |
| Comparative Example 17 | Oxalic acid | 132.07 | X |
| Comparative Example 18 | Phthalic acid | 166.13 | X |
| Comparative Example 19 | Itaconic acid | 130.10 | Δ |
| Comparative Example 20 | Glutaric acid | 132.12 | X |
| Comparative Example 21 | Maleic acid | 116.07 | Δ |
| Comparative Example 22 | Adipic acid | 146.14 | X |

O: No stain observed
Δ: Stain slightly observed
X Substantial stain observed

It is evident from Table 4 that the problem of stain can be solved by the color resist photosensitive solution containing an organic carboxylic anhydride having a molecular weight of at most 800.

As described in the foregoing, with the photopolymerizable composition for a color filter of the present invention, it is possible to substantially reduce the stain at a non-image portion while maintaining high sensitivity and high resolution, at the time of forming a red, green or blue colorant picture element, or a black matrix, by a pigment dispersion method, whereby it is possible to produce a high performance color filter excellent in the color reproducibility and the smoothness of the coating film, at a high line speed constantly and efficiently.

What is claimed is:

1. A color filter, comprising:
    a transparent substrate having a color pattern formed thereon from a photopolymerizable composition which comprises (i) a photopolymerization initiator system, (ii) a compound having at least one ethylenically unsaturated double bond, (iii) a colorant, and (iv) at least one of a phosphoric (meth)acrylate compound and an organic carboxylic anhydride having a molecular weight of at most 800, wherein the content of the colorant in the composition ranges from 20–90 wt. % based on the total solids content.

2. The color filter according to claim 1, wherein the colorant is a black colorant.

3. The photopolymerizable composition for a color filter according to claim 1, wherein the colorant is a red, green or blue colorant, and the content of the colorant is from 20 to 70 wt % based on the total solid content.

4. The color filter according to claim 1, wherein the phosphoric (meth)acrylate compound is a compound of the following formula (I):

wherein $R^1$ is hydrogen or a methyl group, $R^2$ is a $C_{1-15}$ alkylene group optionally having a substituent selected from the group consisting of a $C_{1-15}$ alkyl group, Br, Cl, and a $C_{1-15}$ alkyleneoxy group, a is an integer of from 1 to 3, and n is an integer of from 0 to 10.

5. The color filter according to claim 1, wherein the organic carboxylic anhydride is maleic anhydride or itaconic anhydride.

6. The color filter according to claim 1, which contains an organic binder polymer material.

7. The color filter according to claim 6, wherein the organic binder polymer material is a copolymer comprising a monomer having a phenyl group and a (meth)acrylic acid monomer.

8. The color filter according to claim 1, wherein the compound having at least one ethylenically unsaturated double bond is a monomer having at least three acrylic groups in one molecule.

9. The color filter according to claim 8, wherein the compound having at least one ethylenically unsaturated bond is a dipentaerythritol poly(meth)acrylate having 4–6 (meth)acrylic groups.

10. The color filter according to claim 1, wherein said compound having at least one ethylenically unsaturated double bond has a viscosity of at least 100 ps at 25° C.

11. The color filter according to claim 1, wherein the amount of said phosphoric (meth)acrylate or organic carboxylic anhydride ranges from 0.1–50 wt. % based on the total solids content of the photopolymerizable composition excluding the colorant.

12. The color filter according to claim 6, wherein said organic binder polymer material is an alkali soluble polymer comprising a monomer having a carboxylic acid group.

13. The color filter according to claim 6, wherein said organic binder polymer material is an alkali soluble polymer.

14. The color filter of claim 13, wherein the amount of said organic binder polymer ranges from 0–80 wt. %, based on the total solids content.

15. The photopolymerizable composition for a color filter of claim 14, wherein the amount of said organic binder ranges from 10–70 wt. %.

16. The color filter according to claim 1, wherein said photopolymerizable composition further comprises optionally an organic binder polymer material which is alkali soluble and an organic solvent.

17. The color filter according to claim 16, wherein the amount of said binder polymer ranges from 0–80 wt. %, based on the total solids content.

18. The color filter according to claim 17, wherein said solvent has a boiling point within the range of 100°–200° C.

19. A liquid crystal display device, which comprises:
a transparent substrate having a color filter pattern thereon, which is formed from a photopolymerizable composition comprising (i) a photopolymerization initiator system, (ii) a compound having at least one ethylenically unsaturated double bond, (iii) a colorant, and (iv) at least one of a phosphoric (meth)acrylate or organic carboxylic anhydride having a molecular weight of at most 800, wherein the total content of the colorant ranges from 20–90 wt. % based on the total solids content of the composition.

20. The liquid crystal display device according to claim 19, wherein the colorant is a black colorant.

21. The liquid crystal display device according to claim 19, wherein the colorant is a red, green or blue colorant, and the content of the colorant is from 20–70 wt. % based on the total solids content.

22. The liquid crystal display device according to claim 19, wherein the phosphoric (meth)acrylate compound is a compound of the following formula (I):

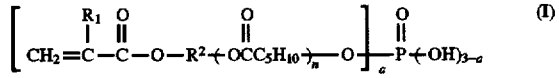

wherein $R^1$ is a hydrogen or a methyl group, $R^2$ is a $C_{1-15}$ alkylene group optionally having a substituent selected from the group consisting of a $C_{1-15}$ alkyl group, Br, Cl, and a $C_{1-15}$ alkyleneoxy group, a is an integer of from 1–3, and n is an integer of from 0–10.

23. The liquid crystal display device according to claim 19, wherein the organic carboxylic anhydride is maleic anhydride or itaconic anhydride.

24. The liquid crystal display device according to claim 19, which contains an organic binder polymer material.

25. The liquid crystal display device according to claim 24, wherein the organic binder polymer material is a copolymer comprising a monomer having a phenyl group and a (meth)acrylic acid monomer.

26. The liquid crystal display device according to claim 19, wherein the compound having at least one ethylenically unsaturated double bond is a monomer having at least three acrylic groups in one molecule.

27. The liquid crystal display device according to claim 26, wherein the compound having at least one ethylenically unsaturated double bond is a dipentaerythritol poly(meth)acrylate having 4–6 (meth)acrylic groups.

* * * * *

UNITED STATES PATENT AND TRADEMARK OFFICE
CERTIFICATE OF CORRECTION

PATENT NO. : 5,800,952
DATED : SEPTEMBER 1, 1998
INVENTOR(S) : Toshiyuki URANO, et al.

It is certified that error appears in the above-identified patent and that said Letters Patent is hereby corrected as shown below:

Column 21, line 61, delete "photopolymerizable composition for a".

Column 23, line 6, delete "photopolymerizable composition for a".

Signed and Sealed this

Twenty-eighth Day of March, 2000

Attest:

Q. TODD DICKINSON

*Attesting Officer*      *Commissioner of Patents and Trademarks*